US009953978B2

(12) United States Patent
Xie et al.

(10) Patent No.: US 9,953,978 B2
(45) Date of Patent: Apr. 24, 2018

(54) REPLACEMENT GATE STRUCTURES FOR TRANSISTOR DEVICES

(71) Applicants: GLOBALFOUNDRIES Inc., Grand Cayman (KY); International Business Machines Corporation, Armonk, NY (US)

(72) Inventors: Ruilong Xie, Niskayuna, NY (US); Kisik Choi, Hopewell Junction, NY (US); Su Chen Fan, Cohoes, NY (US); Shom Ponoth, Gaithersburg, MD (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/981,574

(22) Filed: Dec. 28, 2015

(65) Prior Publication Data
US 2016/0118385 A1 Apr. 28, 2016

Related U.S. Application Data

(62) Division of application No. 13/959,847, filed on Aug. 6, 2013, now Pat. No. 9,257,348.

(51) Int. Cl.
*H01L 27/092* (2006.01)
*H01L 29/66* (2006.01)
(Continued)

(52) U.S. Cl.
CPC .... *H01L 27/0922* (2013.01); *H01L 21/28114* (2013.01); *H01L 21/823842* (2013.01);
(Continued)

(58) Field of Classification Search
None
See application file for complete search history.

(56) References Cited

U.S. PATENT DOCUMENTS 6,316,323 B1 11/2001 Fang et al.
8,436,404 B2 5/2013 Bohr et al.
(Continued)

FOREIGN PATENT DOCUMENTS

| CN | 101656205 A | 2/2010 |
|----|-------------|--------|
| CN | 102386082 A | 3/2012 |
| JP | 2000-223703 A | 8/2011 |

OTHER PUBLICATIONS

Translation of Taiwanese Office Action dated Mar. 11, 2016 for TW Patent Appl. No. 103121307, filed on Jun. 20, 2014.
(Continued)

*Primary Examiner* — Angel Roman
*Assistant Examiner* — Kevin Quinto
(74) *Attorney, Agent, or Firm* — Amerson Law Firm, PLLC

(57) ABSTRACT

A transistor device includes a gate structure positioned above a semiconductor substrate, and spaced-apart sidewall spacers positioned above the substrate and adjacent sidewalls of the gate structure. An internal sidewall surface of each of the spaced-apart sidewall spacers includes an upper sidewall surface portion and a lower sidewall surface portion positioned between the upper sidewall surface portion and a surface of the substrate, wherein a first lateral width between first upper ends of the upper sidewall surface portions is greater than a second lateral width between second upper ends of the lower sidewall surface portions.

17 Claims, 13 Drawing Sheets

(51) Int. Cl.
   *H01L 21/28*       (2006.01)
   *H01L 21/8238*     (2006.01)
   *H01L 29/40*       (2006.01)
   *H01L 29/49*       (2006.01)
   *H01L 29/423*      (2006.01)
   *H01L 29/51*       (2006.01)
   *H01L 29/78*       (2006.01)

(52) U.S. Cl.
   CPC .... *H01L 21/823864* (2013.01); *H01L 27/092* (2013.01); *H01L 29/401* (2013.01); *H01L 29/42376* (2013.01); *H01L 29/4958* (2013.01); *H01L 29/4966* (2013.01); *H01L 29/4983* (2013.01); *H01L 29/517* (2013.01); *H01L 29/6656* (2013.01); *H01L 29/66545* (2013.01); *H01L 29/78* (2013.01)

(56) References Cited

U.S. PATENT DOCUMENTS

| | | | |
|---|---|---|---|
| 8,592,265 B2 | 11/2013 | Kim et al. | |
| 8,928,048 B2 | 1/2015 | Xie et al. | |
| 2010/0044783 A1* | 2/2010 | Chuang | H01L 21/28114 257/328 |
| 2011/0108930 A1 | 5/2011 | Cheng et al. | |
| 2011/0298017 A1 | 12/2011 | Jain et al. | |
| 2011/0298061 A1 | 12/2011 | Siddiqui et al. | |
| 2012/0049247 A1* | 3/2012 | Lee | H01L 21/28114 257/288 |
| 2012/0139061 A1 | 6/2012 | Ramachandran et al. | |
| 2012/0175711 A1 | 7/2012 | Ramachandran et al. | |
| 2012/0322218 A1* | 12/2012 | Lai | H01L 21/82384 438/303 |
| 2013/0248950 A1 | 9/2013 | Kang et al. | |

OTHER PUBLICATIONS

Notice of Allowance from related U.S. Appl. No. 13/947,670 dated Apr. 17, 2015.
Notice of Allowance from related U.S. Appl. No. 14/172,058 dated Apr. 6, 2015.
Translation of Taiwanese Office Action dated Sep. 21, 2016 for TW Patent Appl. No. 103121307, filed on Jun. 20, 2014.
Translation of Chinese Second Office Action dated May 3, 2017 for CN Patent Appl. No. 201410383611.9, filed on Aug. 6, 2014.
Translation of Chinese Office Action dated Sep. 1, 2016 for CN Patent Appl. No. 201410383611.9, filed on Aug. 6, 2014.
Translation of Chinese Third Office Action dated Oct. 11, 2017 for CN Patent Appl. No. 201410383611.9, filed on Aug. 6, 2014.

* cited by examiner

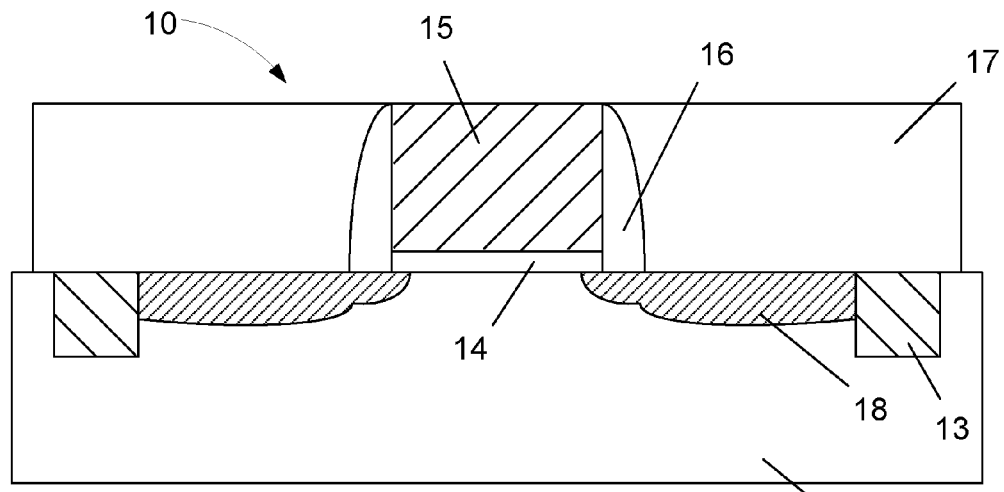
(Prior Art) Figure 1A
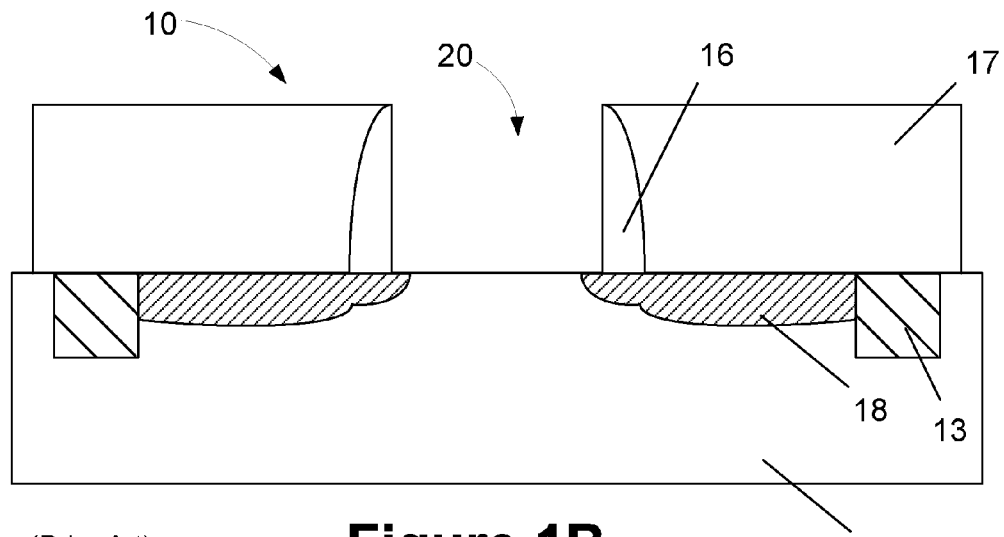
(Prior Art) Figure 1B

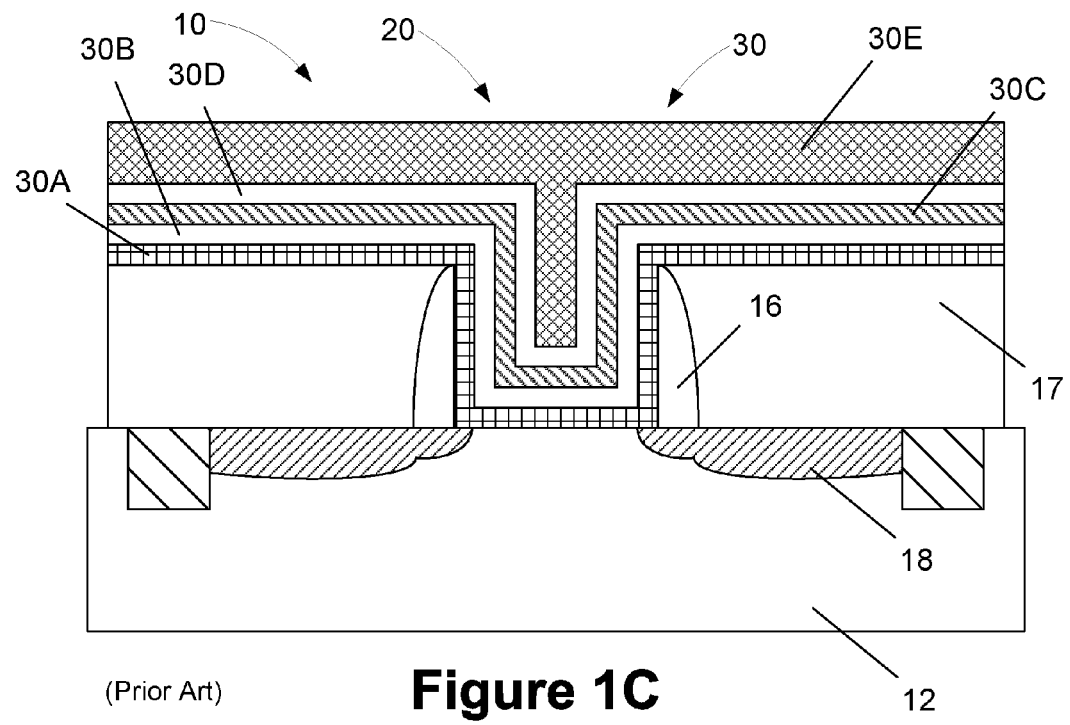
(Prior Art) Figure 1C
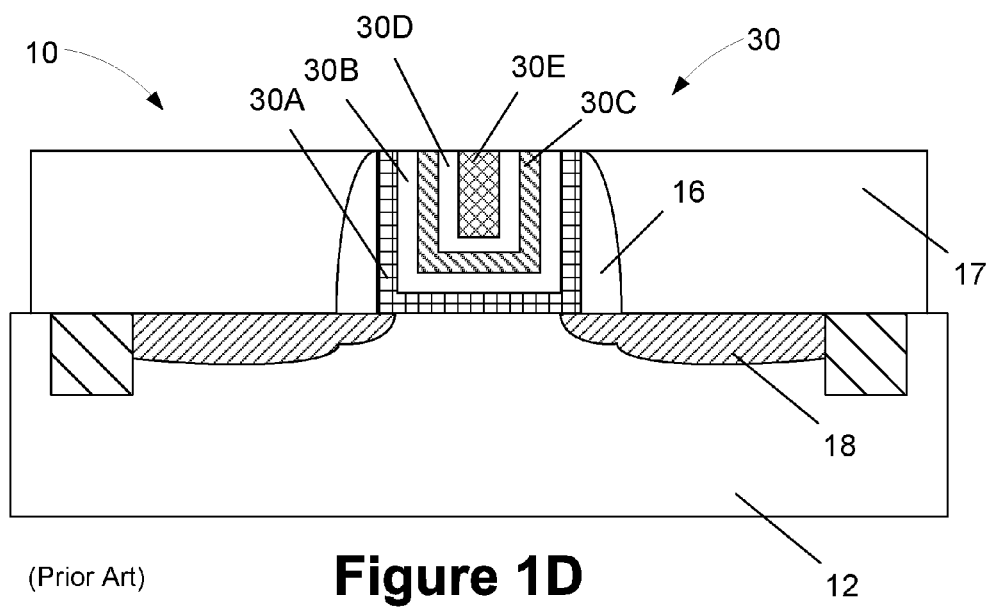
(Prior Art) Figure 1D

REPLACEMENT GATE STRUCTURES FOR TRANSISTOR DEVICES

BACKGROUND

1. Field of the Disclosure

Generally, the present disclosure relates to the manufacture of semiconductor devices, and, more specifically, to various novel methods of forming replacement gate structures for transistor devices and the resulting devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one important type of circuit element that substantially determines performance of the integrated circuits. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices.

Field effect transistors, whether an NMOS or a PMOS device, typically include a source region, a drain region, a channel region that is positioned between the source region and the drain region, and a gate electrode positioned above the channel region. Current flow through the FET is controlled by controlling the voltage applied to the gate electrode. For an NMOS device, if there is no voltage (or a logically low voltage) applied to the gate electrode, then there is no current flow through the device (ignoring undesirable leakage currents, which are relatively small). However, when an appropriate positive voltage (or logically high voltage) is applied to the gate electrode, the channel region of the NMOS device becomes conductive, and electrical current is permitted to flow between the source region and the drain region through the conductive channel region. For a PMOS device, the control voltages are reversed. Field effect transistors may come in a variety of different physical shapes, e.g., so-called planar FET devices or so-called 3D or FinFET devices.

For many decades, planar FET devices were the dominant choice for making integrated circuit products due to the relatively easier manufacturing methods that are used to form such planar devices as compared to the manufacturing methods involved in forming 3-D devices. To improve the operating speed of planar FETs, and to increase the density of planar FETs on an integrated circuit device, device designers have greatly reduced the physical size of planar FETs over the years. More specifically, the channel length of planar FETs has been significantly decreased, which has resulted in improving the switching speed of planar FETs. However, decreasing the channel length of a planar FET also decreases the distance between the source region and the drain region. In some cases, this decrease in the separation between the source and the drain regions makes it difficult to efficiently inhibit the electrical potential of the source region and the channel from being adversely affected by the electrical potential of the drain region. This is sometimes referred to as so-called short channel effects, wherein the characteristic of the planar FET as an active switch is degraded.

As noted above, in contrast to a planar FET, a so-called 3D or FinFET device has a three-dimensional (3D) structure. More specifically, in a FinFET, a generally vertically positioned fin-shaped active area is formed in a semiconductor substrate and a gate structure (gate insulation layer plus the gate electrode) is positioned around both of the sides and the upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin, become a conductive channel region, thereby allowing current to flow. In a FinFET device, the "channel-width" is approximately two times (2x) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

For many early device technology generations, the gate structures of most transistor elements has been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1A-1D simplistically depict one illustrative prior art method for forming an HK/MG replacement gate structure using a replacement gate technique. As shown in FIG. 1A, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1A, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1B, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications.

Next, as shown in FIG. 1C, various layers of material that will constitute a replacement gate structure 30 are formed in the gate cavity 20. Even in cases where the sacrificial gate insulation layer 14 is intentionally removed, there will typically be a very thin native oxide layer (not shown) that forms on the substrate 12 within the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten. Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

As the gate length of transistor devices has decreased, the physical size of the gate cavity 20 has also decreased. Thus, it is becoming physically difficult to fit all of the needed layers of material needed for the replacement gate structure 30, particularly for NMOS devices due to the greater number of layers of material that are typically used to form the gate structures for the NMOS devices, within the reduced-size gate cavity. For example, as gate lengths continue to decrease, voids or seams may be formed as the various layers of material are deposited into the gate cavity 20. Such voids or seams may result in devices that perform at levels less than anticipated or, in some cases, the formation of devices that are simply not acceptable and have to be discarded.

The present disclosure is directed to various novel methods of forming replacement gate structures for transistor devices and the resulting devices that may solve or reduce one or more of the problems identified above.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to various novel methods of forming replacement gate structures for transistor devices and the resulting devices. One illustrative transistor device disclosed herein includes, among other things, a gate structure positioned above a semiconductor substrate, and spaced-apart sidewall spacers positioned above the substrate and adjacent sidewalls of the gate structure. An internal sidewall surface of each of the spaced-apart sidewall spacers includes an upper sidewall surface portion and a lower sidewall surface portion positioned between the upper sidewall surface portion and a surface of the substrate, wherein a first lateral width between first upper ends of the upper sidewall surface portions is greater than a second lateral width between second upper ends of the lower sidewall surface portions.

Another exemplary transistor device of the present disclosure includes a gate structure that is positioned above a semiconductor substrate and spaced-apart sidewall spacers that are positioned above the substrate and adjacent sidewalls of the gate structure, wherein an internal sidewall surface of each of the spaced-apart sidewall spacers has a stepped cross-sectional configuration that includes an upper sidewall surface portion and a lower sidewall surface portion positioned between the upper sidewall surface portion and an upper surface of the substrate. Furthermore, the upper sidewall surface portions define a first space therebetween having a substantially constant first lateral width extending from lower ends of the upper sidewall surface portions located proximate respective upper ends of the lower sidewall surface portion to upper ends of the upper sidewall surface portions located proximate an upper surface of the gate structure, and the lower sidewall surface portions define a second space therebetween having a substantially constant second lateral width extending from lower ends of the lower sidewall surface portions located proximate the upper surface of the substrate to the upper ends of the lower sidewall surface portions located proximate the respective lower ends of the upper sidewall surface portions. Additionally, the first lateral width is greater than the second lateral width.

Also disclosed herein is an illustrative integrated circuit product that includes a first transistor and a second transistor. Furthermore, the first transistor includes, among other things, a first gate structure having a first work function adjusting metal layer positioned above a first gate insulation layer, and a first pair of sidewall spacers positioned adjacent opposite sidewalls of the first gate structure. Each of the first pair of sidewall spacers have internal sidewall surfaces that include a first untrimmed lower surface portion and a first trimmed upper surface portion located above the first untrimmed lower surface portion, wherein a lateral width between upper ends of the first trimmed upper surface portions is greater than a lateral width between upper ends of the first untrimmed lower surface portions. Additionally, the second transistor includes a second gate structure having a second work function adjusting metal layer positioned above a second gate insulation layer, and a second pair of sidewall spacers positioned adjacent opposite sidewalls of the second gate structure. Moreover, each of the second pair of sidewall spacers have internal sidewall surfaces that include a second untrimmed lower surface portion and a second trimmed upper surface portion located above the second untrimmed lower surface portion, wherein a lateral width between upper ends of the second trimmed upper surface portions is greater than a lateral width between upper ends of the second untrimmed lower surface portions.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art method of forming a gate structure of the transistors using a so-called "replacement gate" technique.

Figure 2A:
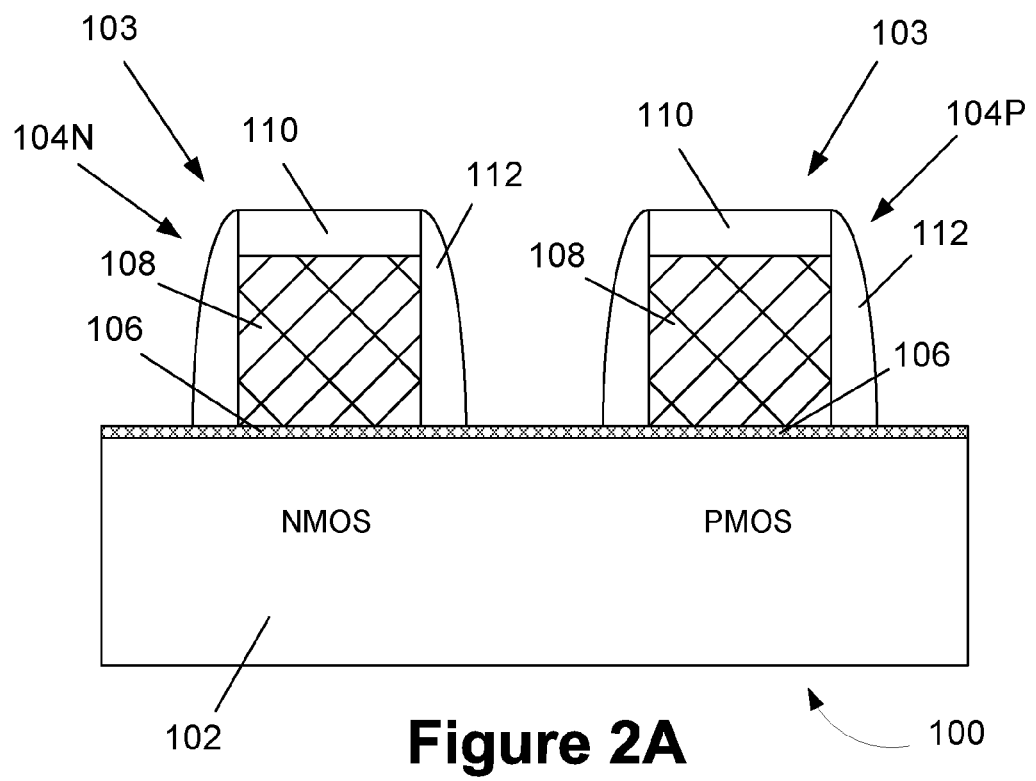
FIGS. 2A-2U depict various illustrative methods disclosed herein for forming replacement gate structures for transistor devices and illustrative examples of novel integrated circuit products.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various novel methods of forming replacement gate structures for transistor devices and the resulting devices. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

As will be appreciated by those skilled in the art after a complete reading of the present application, the inventions disclosed herein may be employed in forming integrated circuit products using planar transistor devices, as well as so-called 3D devices, such as FiNFETs, or a combination of such devices. For purposes of disclosure, reference will be made to an illustrative process flow wherein an integrated circuit product is formed with a plurality of planar transistor devices using CMOS technology. However, the inventions disclosed herein should not be considered to be limited to such an illustrative example.

FIG. 2A is a simplified view of an illustrative integrated circuit product 100 at an early stage of manufacturing.

Illustrative NMOS transistor 104N and PMOS transistor 104P will be formed in and above the semiconductor substrate 102. So as not to obscure the inventions disclosed herein, isolation regions that are formed in the substrate 102 to define active regions where the transistors 104N, 104P will be formed are not depicted in the attached drawings. Additionally, various doped regions, e.g., source/drain regions, halo implant regions, well regions and the like, are also not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

In the example disclosed herein, the transistors 104N, 104P will be formed using a replacement gate technique. Accordingly, FIG. 2A depicts the product 100 at a point in fabrication wherein sacrificial gate structures 103 have been formed above the substrate 102. As noted above, at this point in the replacement gate process flow, source/drain regions (not shown) would have already been formed in the substrate 102 and an anneal process would have been performed to activate the implanted dopant materials and repair any damage to the substrate 102 due to the various ion implantation processes that were performed. The sacrificial gate structures 103 include a sacrificial gate insulation layer 106 and a dummy or sacrificial gate electrode 108. Also depicted are illustrative sidewall spacers 112 and illustrative gate cap layers 110. The various components and structures of the product 100 may be formed using a variety of different materials and by performing a variety of known techniques. For example, the sacrificial gate insulation layer 106 may be comprised of silicon dioxide, the sacrificial gate electrode 108 may be comprised of polysilicon, the sidewall spacers 112 and the gate cap layers 110 may be comprised of silicon nitride. The layers of material depicted in FIG. 2A, as well as the layers of materials described below, may be formed by any of a variety of different known techniques, e.g., a chemical vapor deposition (CVD) process, an atomic layer deposition (ALD) process, a thermal growth process, etc. Although not depicted in the attached drawings, at this point in the process flow, raised source/drain regions may be formed in the substrate using traditional techniques, e.g., formation of cavities that are self-aligned to the spacers 112, epi deposition of a semiconductor material in the cavities, doping, etc. So as not to obscure the present invention, such raised source/drain regions are not depicted in the attached drawings. Moreover, the presently disclosed inventions may be practiced on transistor devices that have regular or planar source/drain regions.

Figure 2B:
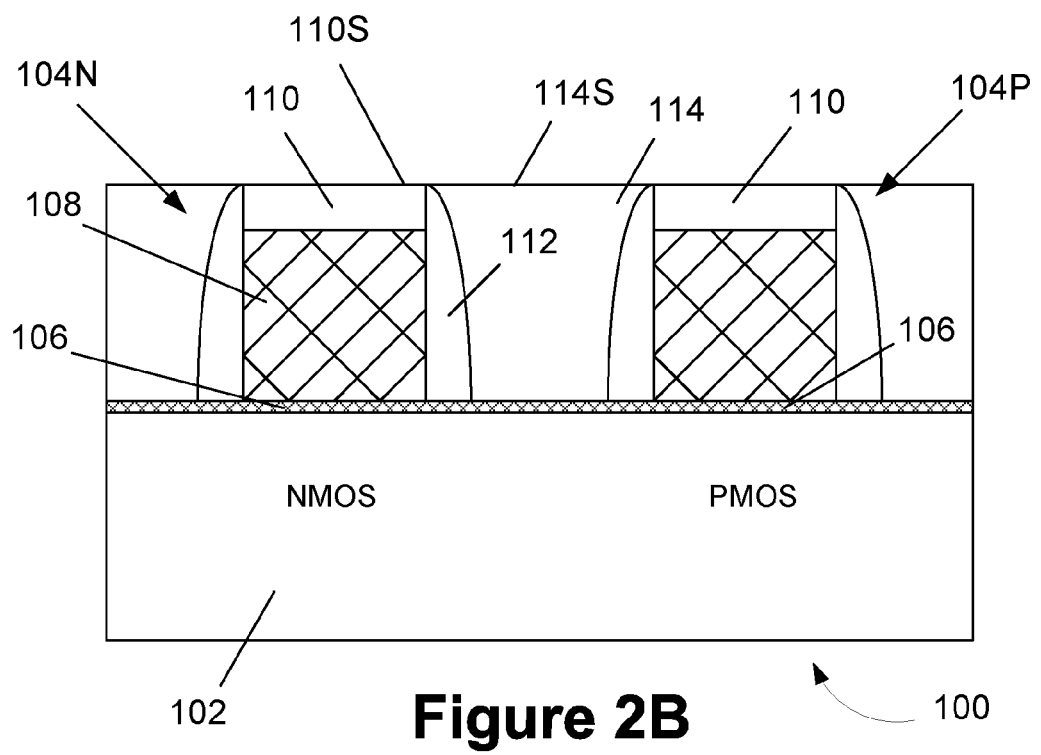

FIG. 2B depicts the product 100 after several process operations were performed. First, a layer of insulating material 114, e.g. silicon dioxide, a low-k material (k value less than about 3.3), etc., has been deposited above the product 100. Thereafter, a planarization process was performed on the layer of insulating material 114 such that the upper surface 114S of the layer of insulating material 114 is substantially even with the upper surface 110S of the gate cap layers 110. Importantly, this planarization process exposes the upper surface 110S of the gate cap layers 110 such that they can be removed. In one illustrative embodiment, the planarization process may be a chemical mechanical planarization (CMP) process that stops on the gate cap layers 110, or it may be a timed etch-back process that removes the layer of insulating material 114 selectively relative to the gate cap layers 110. In one embodiment, the layer of insulating material 114 may be a layer of silicon dioxide that is formed by performing a CVD process. The layer of insulating material 114 may be formed to any desired thickness.

Figure 2C:
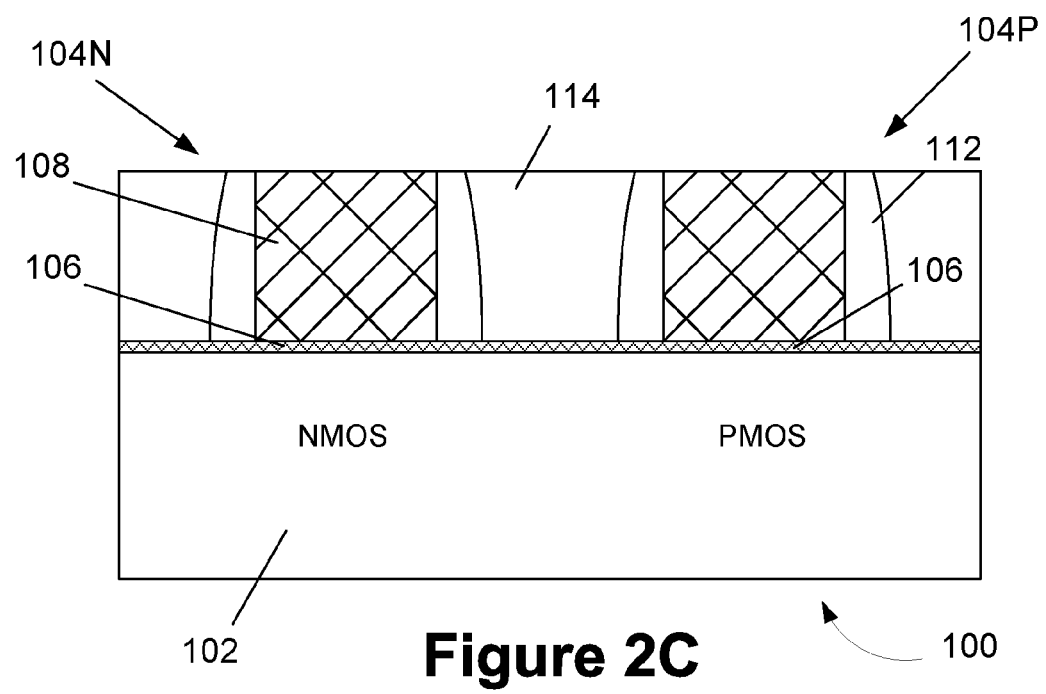

FIG. 2C depicts the product 100 after one or more additional planarization processes have been performed to remove the gate cap layers 110 and expose the sacrificial gate electrode 108. In one example, the structure depicted in FIG. 2C may be achieved by initially performing a dry etching process to remove the gate cap layers 110 selectively relative to the sacrificial gate electrode 108, followed by performing another CMP process that stops on the now-exposed sacrificial gate electrode 108. Those skilled in the art will recognize that there are other processing sequences that may be performed so as to result in the structure depicted in FIG. 2C. Whatever particular processing sequence is selected, the sacrificial gate electrode 108 is exposed and ready to be removed.

Figure 2D:
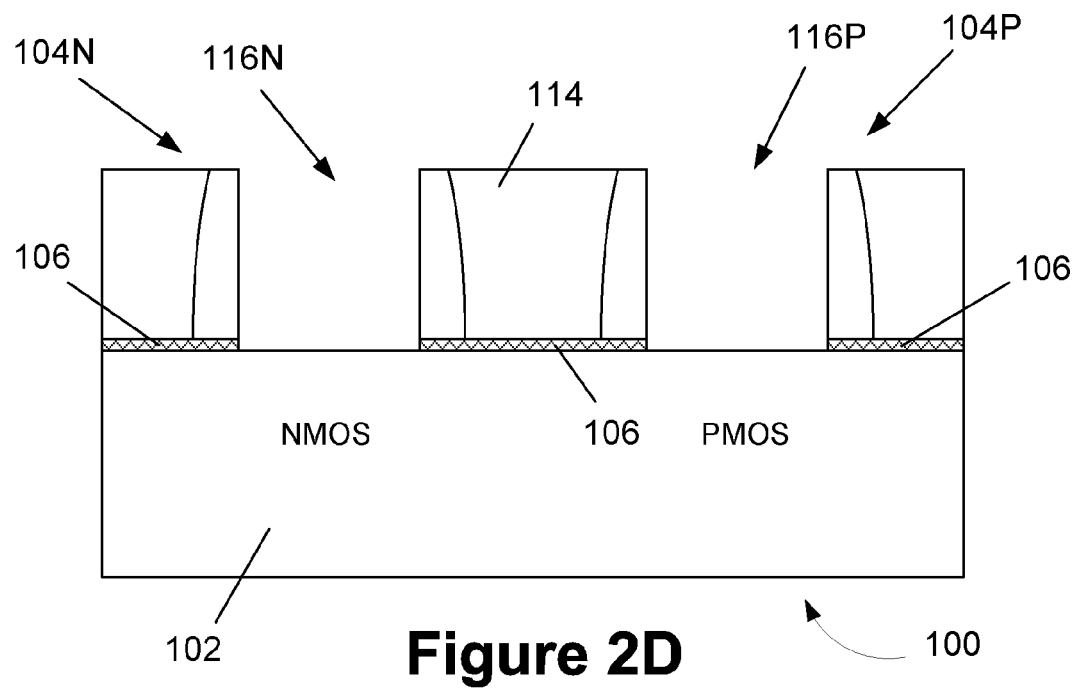

Next, as shown in FIG. 2D, one or more wet or dry etching processes are performed to remove the sacrificial gate electrode 108 and the sacrificial gate insulation layer 106 to thereby define gate cavities 116N, 116P where a replacement gate structure will subsequently be formed for the transistors 104N, 104P, respectively. Typically, the sacrificial gate insulation layer 106 is removed as part of the replacement gate technique, as depicted herein. However, the sacrificial gate insulation layer 106 may not be removed in all applications. Even in cases where the sacrificial gate insulation layer 106 is intentionally removed, there will typically be a very thin native oxide layer (not shown) that forms on the substrate 102 within the gate cavities 116N, 116P.

Figure 2E:
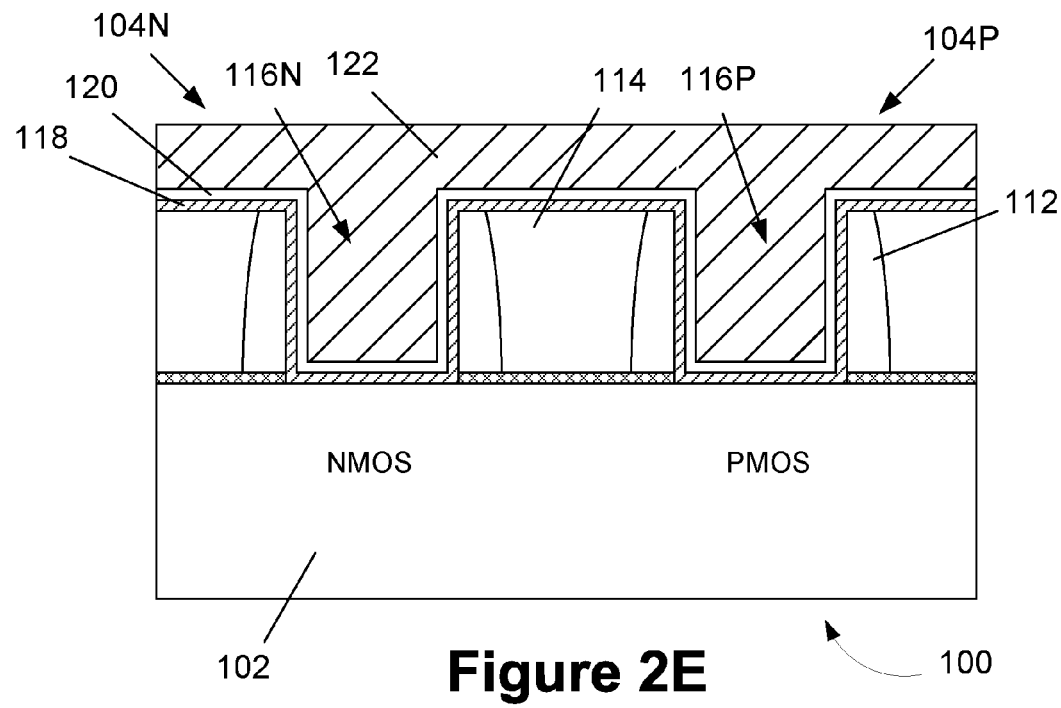

FIG. 2E depicts the product after several process operations were performed. First, a pre-clean process was performed in an attempt to remove all foreign materials from within the gate cavities 116N, 116P prior to forming the various layers of material that will become part of the replacement gate structures. Thereafter, a high-k (k value greater than 10) gate insulation layer 118, such as hafnium oxide, having a thickness of approximately 2 nm was initially deposited in the gate cavities 116N, 116P by performing an ALD process. Then, a first metal layer 120 (e.g., a layer of titanium nitride with a thickness of about 1-5 nm and, in one particular embodiment, about 4 nm) was formed on the high-k gate insulation layer 118 and within the gate cavities 116N, 116P. The first metal layer 120 is comprised of a metal that will serve as the work function adjusting metal for the PMOS transistor 104P and it will act as a barrier layer for both of the transistors 104N, 104P in an anneal process that will be performed to increase the reliability of the high-k gate insulation layer 118, as described more fully below. Typically, the first metal layer 120 is usually thin enough such that there may not be subsequent gap fill issues when it comes to forming subsequent layers of material in the gate cavity 116P. In one example, the first metal layer 120 may be formed by performing an ALD process. Next, a silicon-containing material layer 122, such as polysilicon or amorphous silicon, is blanket-deposited on the product 100 so as to over-fill the gate cavities 116N, 116P. The silicon-containing material layer 122 may be formed by performing, for example, a CVD process. After the silicon-containing material layer 122 is formed, an anneal process may be performed to increase the reliability of the high-k gate insulation layer 118. The parameters of such an anneal process are well known to those skilled in the art.

Figure 2F:
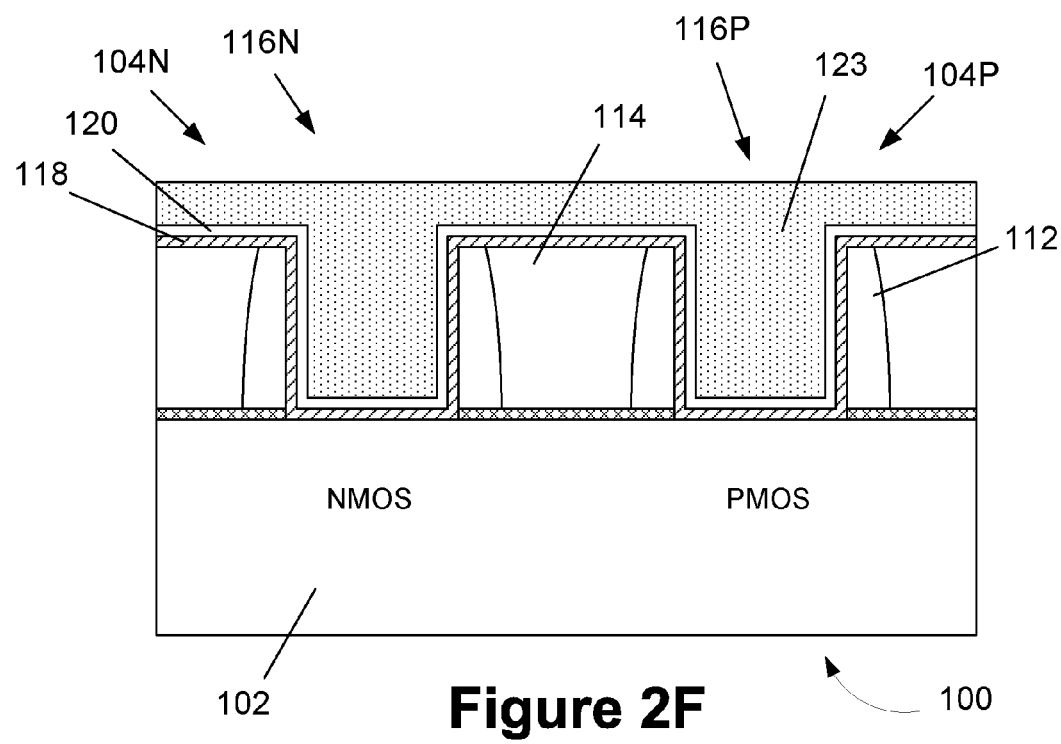

FIG. 2F depicts the product 100 after the silicon-containing material 122 was removed and a flowable material layer 123 that is made of a material that is capable of reliably filling very small width openings, such as an OPL material, was formed so as to over-fill the remaining portions of the gate cavities 116N, 116P. Such a material may be formed using a spin-coating process.

Figure 2G:
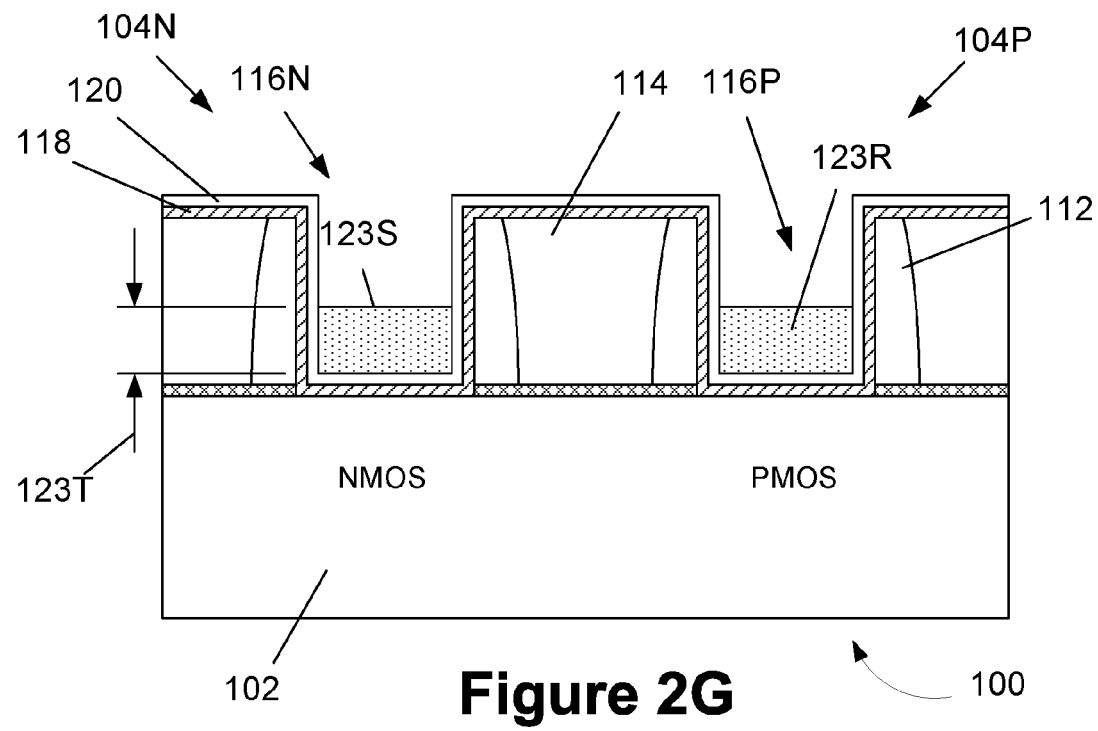

FIG. 2G depicts the product 100 after a dry etching process was performed on the flowable material layer 123 to thereby produce a recessed flowable material layer 123R having a recessed upper surface 123S. This recessing process leaves the recessed flowable material layer 123R positioned only in the gate cavities 116N, 116P. In one illustrative example, the recessing process is performed in such a manner that the thickness 123T of the recessed flowable material layer 123R remaining in the gate cavities 116N, 116P is about 10-20 nm.

Figure 2H:
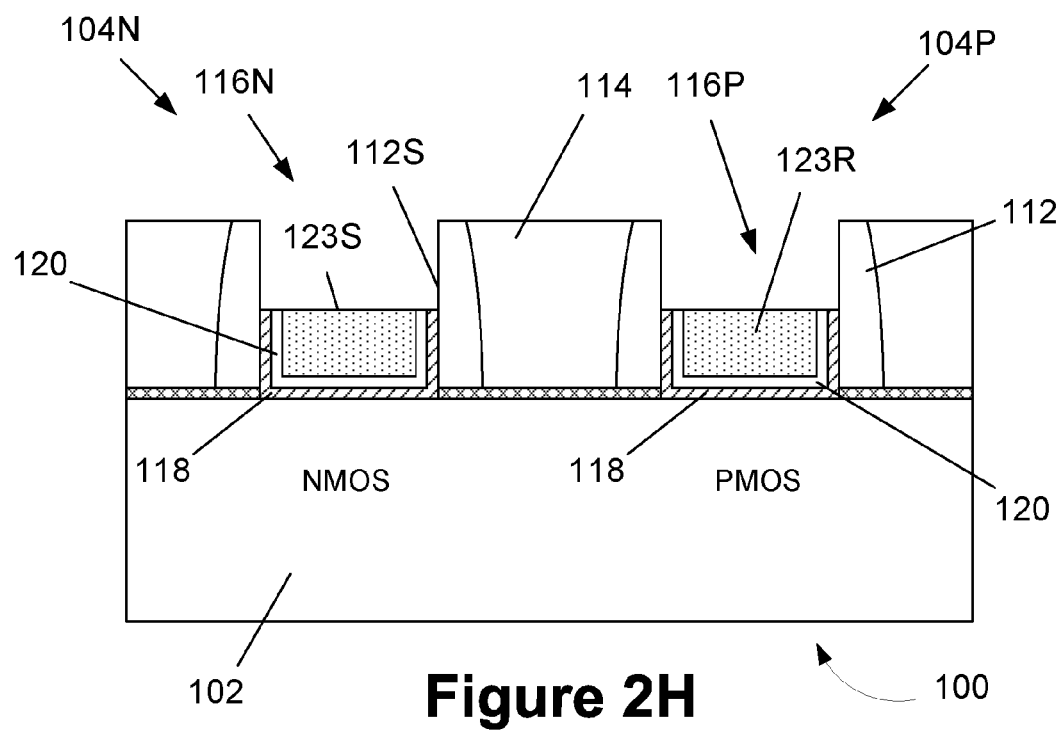

FIG. 2H depicts the product 100 after one or more dry or wet etching processes were performed to remove portions of the high-k gate insulation layer 118 and the first metal layer 120 positioned on the sidewalls within the gate cavities 116N, 116P above the recessed flowable material layer 123R. Removing these materials exposes the inner sidewalls 112S of the spacers 112 for further processing.

Figure 2I:
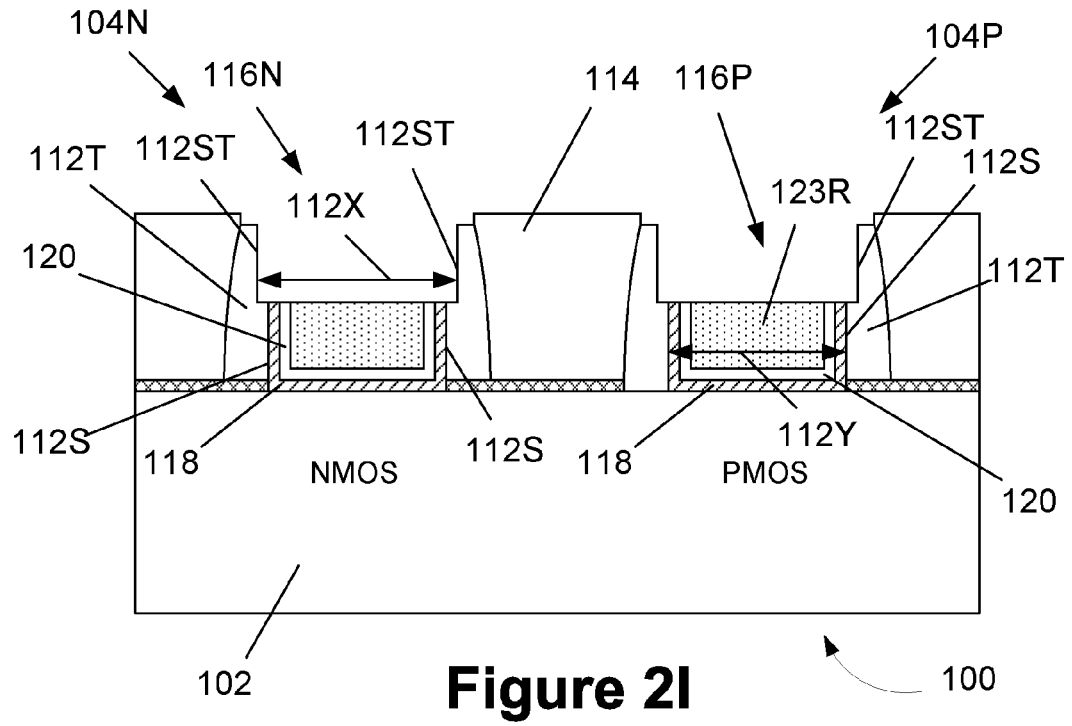
Figure 2J:
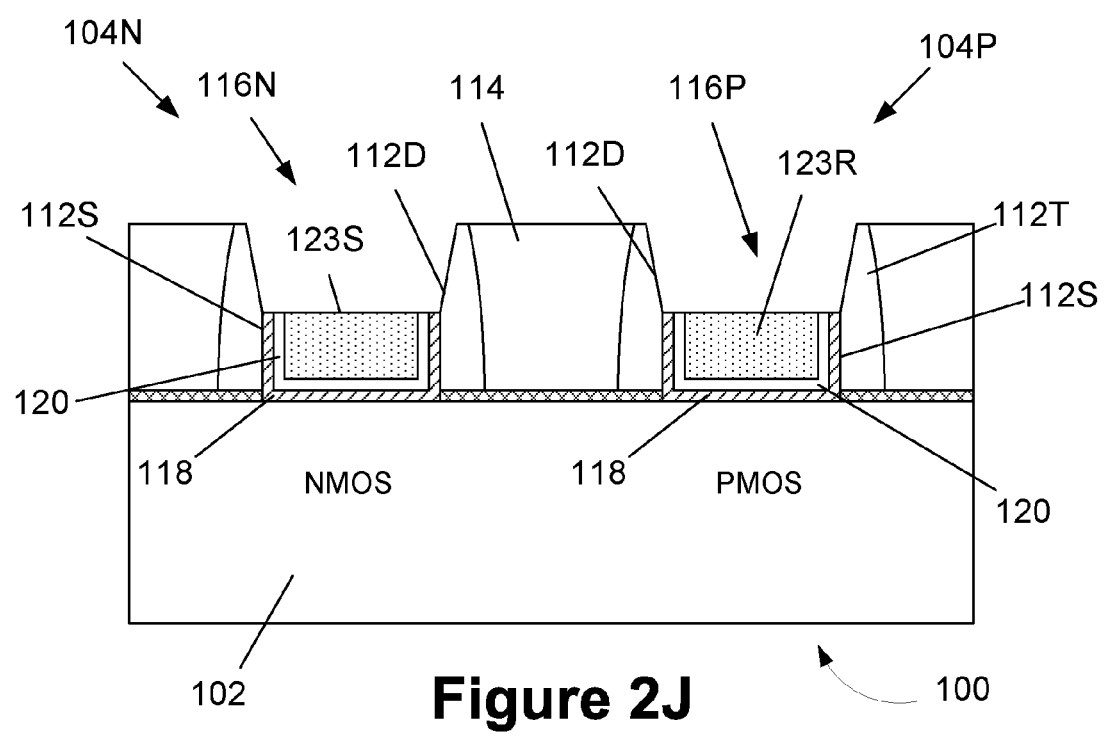

FIG. 2I depicts the product 100 after an internal spacer trimming process was performed that results in internally trimmed spacers 112T. More specifically, a timed anisotropic or isotropic etching process was performed to reduce the lateral thickness of each of the spacers 112 above the recessed flowable material layer 123R by about 1-2 nm. This spacer trimming process results in internally trimmed spacers 112T have a trimmed internal sidewall surface 112ST and a portion of its original, un-etched sidewall surface 112S. In one embodiment, the trimmed spacers 112T have a stepped cross-sectional profile that defines an upper opening or space having a generally rectangular-shaped configuration with a width 112X (between the trimmed internal sidewall surfaces 112ST) that is greater than a width 112Y (between the original un-etched sidewall surfaces 112S of the spacers 112) of a lower opening or space. Thus, the spacer trimming process results in a widening of the opening of the gate cavities 116N, 116P. In some cases, rather than the stepped configuration shown in FIG. 2I, the spacer trimming process may result in the trimmed spacers 112T having a tapered, etched upper internal sidewall portion 112D, as shown in FIG. 2J. The tapered sidewall portions 112D also results in a widening of the opening of the gate cavities 116N, 116P. In the following drawings, only the stepped configuration of the spacers 112T, as shown in FIG. 2I, will be shown.

Figure 2K:
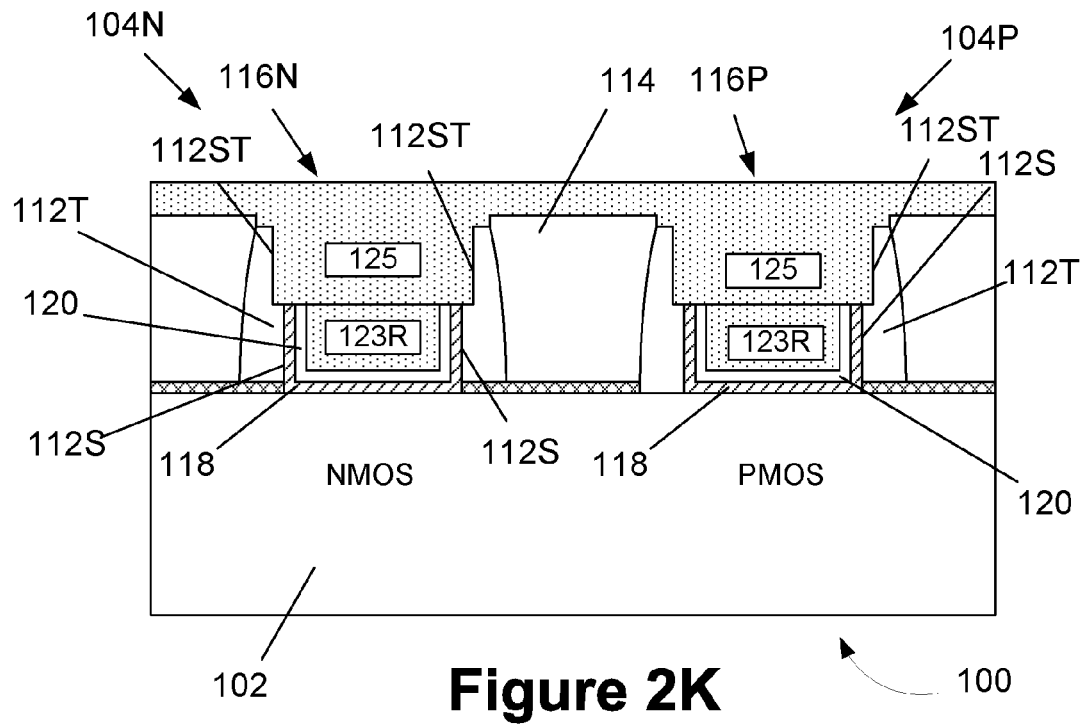

FIG. 2K depicts the product 100 after a second flowable material layer 125 that is made of a material that is capable of reliably filling very small width openings, such as an OPL material, was formed so as to over-fill the remaining portions of the gate cavities 116N, 116P. Note that, in one embodiment, it is not necessary to remove the recessed flowable material layer 123R that is already positioned in the gate cavities 116N, 116P prior to forming the flowable material layer 125. However, if desired, the recessed flowable material layer 123R may be stripped prior to the formation of the second flowable material layer 125. The flowable material layer 125 may be made of the same or a different material than that of the flowable material layer 123.

Figure 2L:
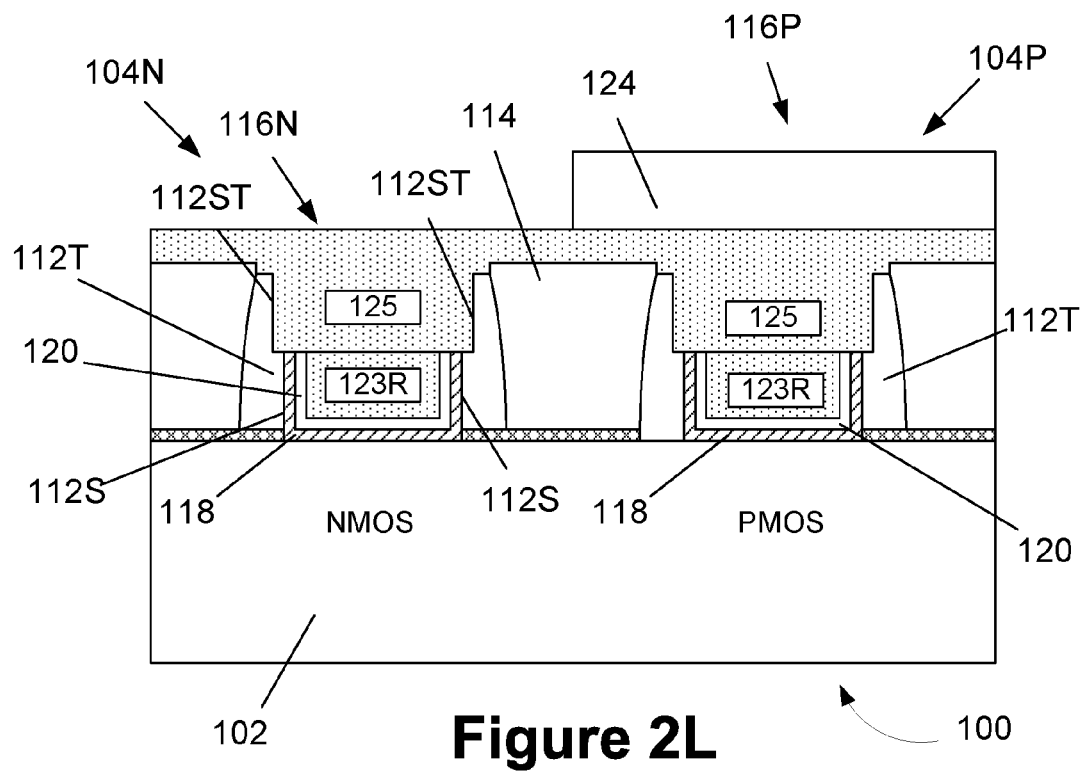

FIG. 2L depicts the product 100 after a patterned masking layer 124 is formed above the product 100. The patterned masking layer 124 covers the PMOS region while leaving the NMOS region exposed for further processing. In one embodiment, the patterned masking layer 124 may be a patterned layer of photoresist material that may be formed using known photolithography tools and techniques. If desired, the patterned mask layer 124 may also include an upper anti-reflective coating (ARC) layer (not shown) comprised of, for example, titanium.

Figure 2M:
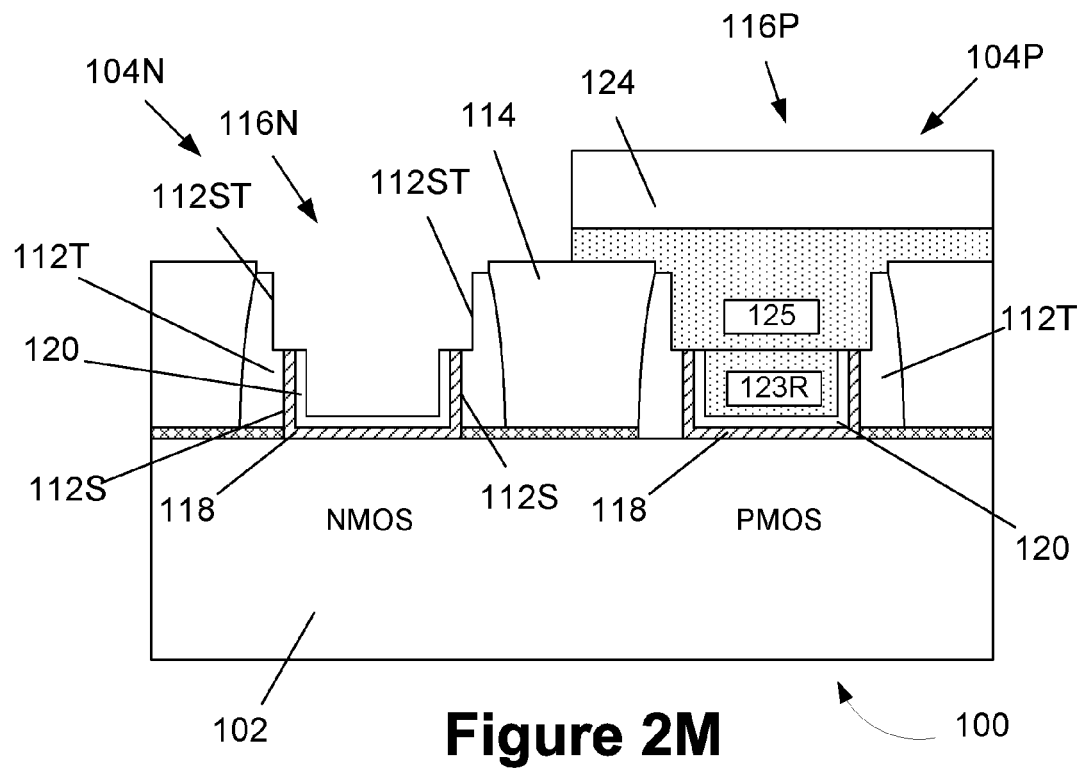

FIG. 2M depicts the product 100 after one or more dry etching processes were performed to remove all of the flowable material (layers 123R and/or 125) from within the gate cavity 116N for the NMOS device 104N. This exposes the first metal layer 120 within the gate cavity 116N for further processing. In some cases, the etching process may result in the removal of all or substantially all of the patterned mask layer 124. Thus, in the drawing following FIG. 2M, the layer 124 will be depicted as having been removed during this etching process.

Figure 2N:
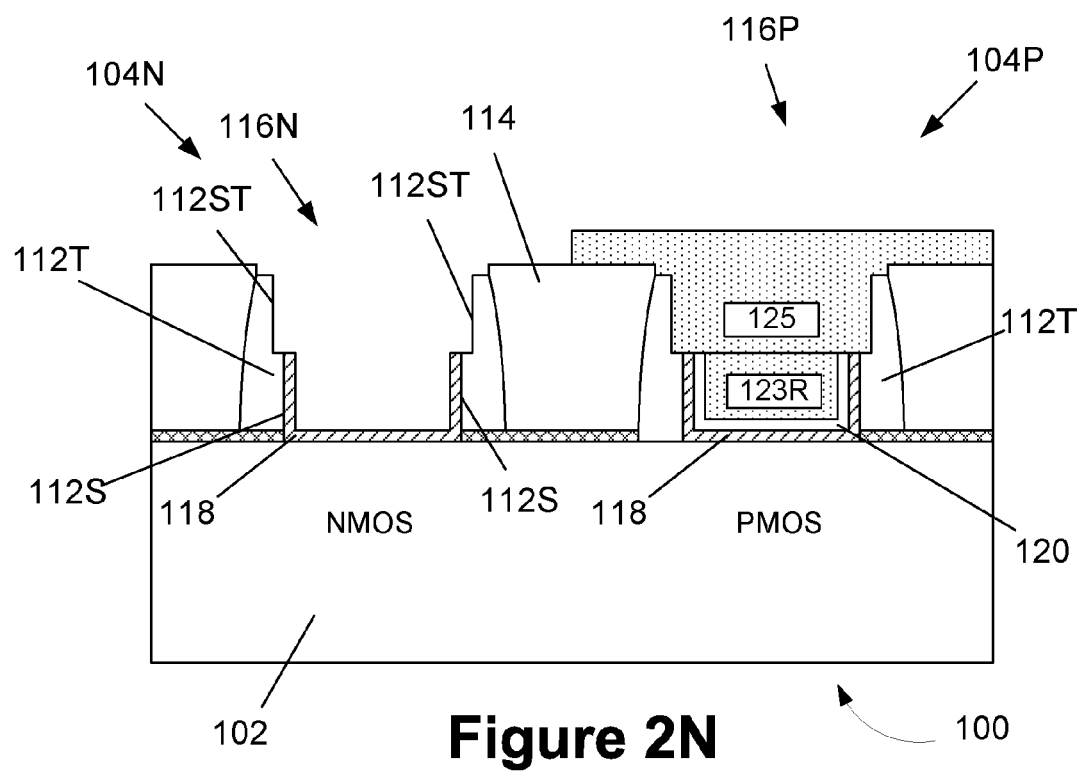

FIG. 2N depicts the product 100 after one or more dry or wet etching processes were performed to remove the exposed portions of the first metal layer 120 (the P-work function metal) from the gate cavity 116N. To the extent that an ARC layer (not shown) was present under the masking layer 124, the ARC layer may likewise be removed during the process of removing the first metal layer 120 from the gate cavity 116N.

Figure 2O:
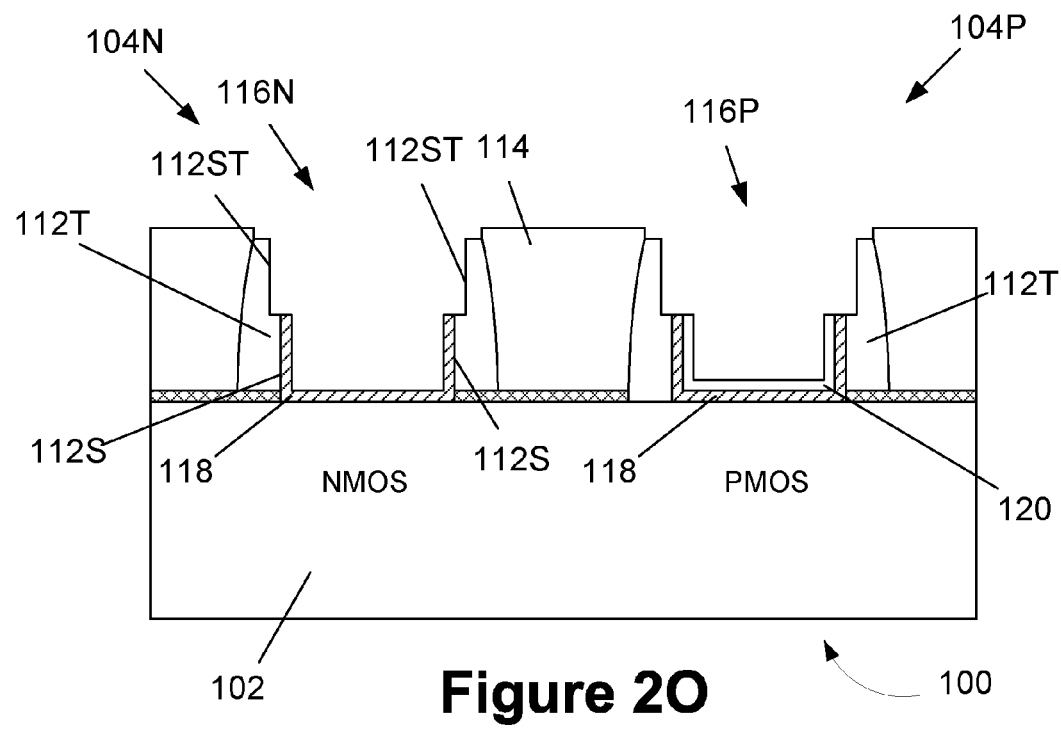

FIG. 2O depicts the product 100 after several process operations were performed to remove all of the flowable material (layers 123R and/or 125) from within the gate cavity 116P for the PMOS device 104P. Such process operations may involve performing one or more dry or wet etching processes or combinations thereof.

Figure 2P:
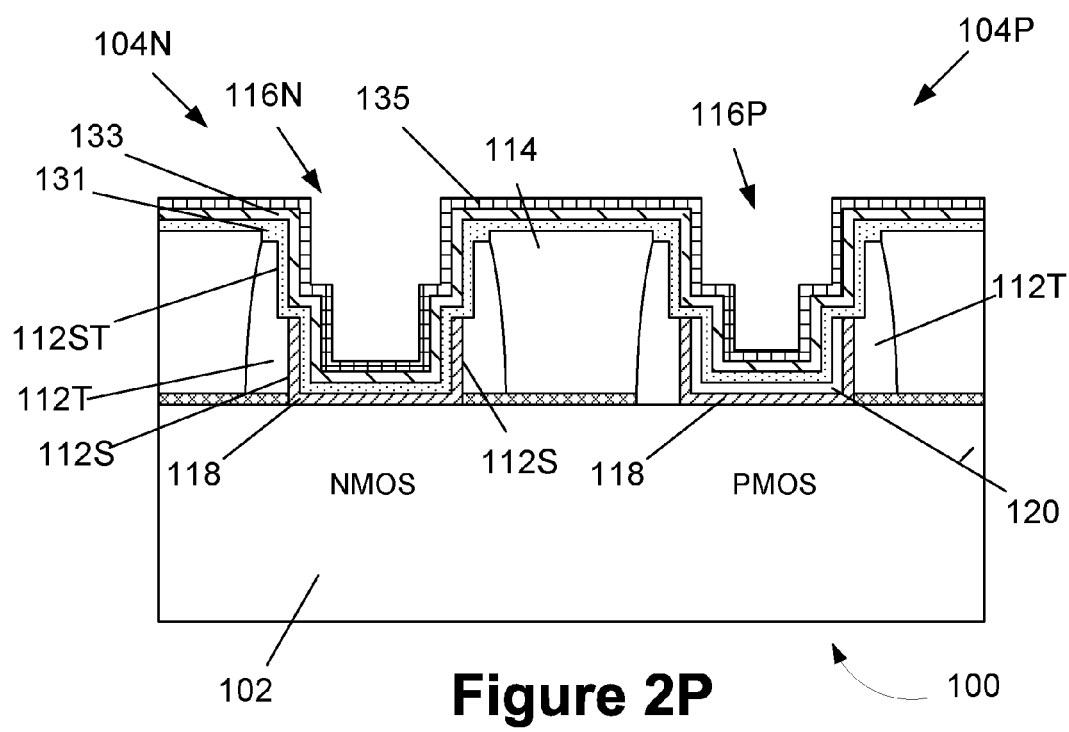

FIG. 2P depicts the product 100 after several process operations were performed to form the materials that will constitute the work function metal for the NMOS device 104N and various barrier layers. For example, a first N-metal layer 131 (e.g., a layer of titanium nitride with a thickness of about 1-2 nm), a second N-metal layer 133—a so-called work function adjusting metal layer for the NMOS device—(e.g., a layer of titanium-aluminum or titanium-aluminum-carbon with a thickness of about 5 nm), a third N-metal layer 135 (e.g., a layer of titanium nitride with a thickness of about 1-2 nm) are sequentially deposited in both of the gate cavities 116N, 116P. The attached drawings are not to scale, but as those skilled in the art will appreciate, forming so many layers of material into the gate cavities, especially for the NMOS device 104N, can be very challenging.

Figure 2Q:
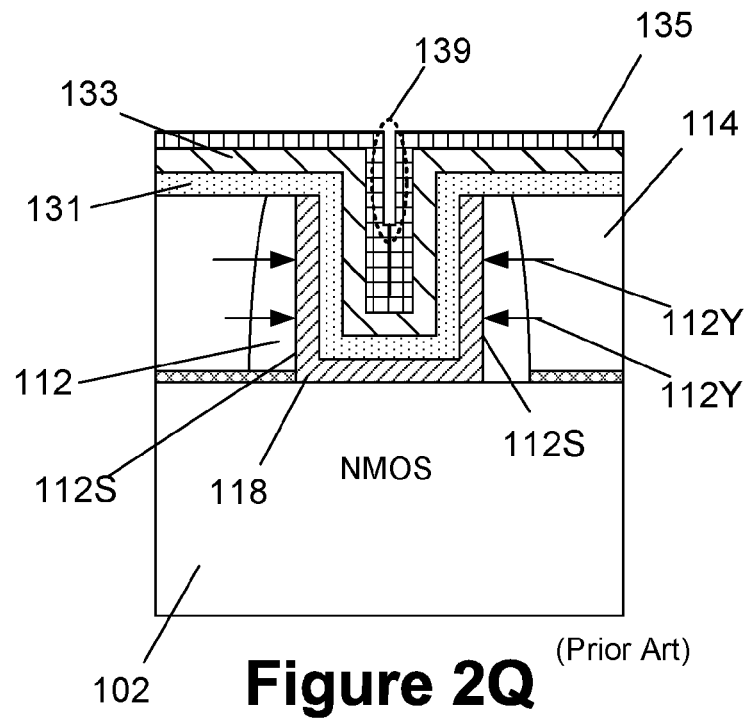

In a real-world device, there is very limited space in the gate cavity 116N after these layers of material 131, 133 and 135 are formed. FIG. 2Q is a somewhat enlarged view of an illustrative NMOS device that is formed without the novel internally trimmed spacers 112T disclosed herein and without removing any portion of the gate insulation layer 118 near the upper portions of the gate cavity 116N. FIG. 2Q is provided in an attempt to provide the reader with some idea of just how limited the lateral space 139 is within the gate cavity of an NMOS device after the various metal layers 131, 133 and 135 are formed in the gate cavity. In FIG. 2Q, the device includes traditional untrimmed spacers 112 with internal sidewall surfaces 112S that define a gate cavity having a substantially uniform width 112Y throughout the height or depth of the gate cavity. Using such untrimmed spacers 112, the lateral space 139 may be about 1-2 nm in width or even smaller such that known materials, such as flowable oxide materials, cannot reliably fill the space 139. In some cases, the space 139 may be essentially non-existent. Traditionally, an etch back process is performed on the layers 131, 133 and 135 to make room within the upper portion of the gate cavity for a bulk conductor material, such as tungsten and aluminum and a gate cap layer. During this recess etching process, some form of a protective material will be formed in the gate cavity above the metal layer 135 to protect desired portions of the underlying metal layers 131, 133 and 135 during the recess etching process. If the lateral space 139 (to the extent it exists) cannot be reliably filled with such a protective material, then the recessing etching process cannot be performed for fear of removing desired portions of the metal layers 135, 133 and/or 131 during the course of performing the recess etching on the layers 131, 133 and 135.

Figure 2R:
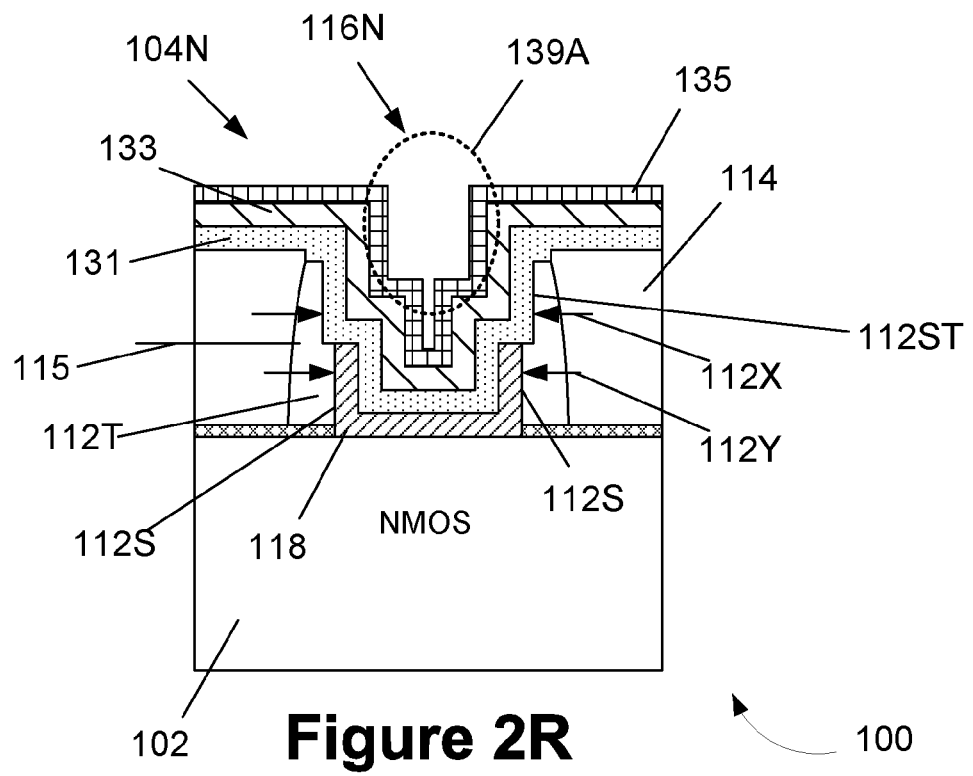

FIG. 2R is a somewhat enlarged view of the NMOS device 104N disclosed herein that includes the trimmed spacers 112T disclosed herein. Also note that using the methods disclosed herein, portions of the gate insulation layer 118 near the upper part or opening of the gate cavity 116N may also be removed. As depicted, in this example, the gate cavity 116N has a stepped profile wherein a first portion or depth of the cavity 116N has a first width 112Y (defined by the untrimmed internal surfaces 112S of the spacer 112T) and a second portion or depth wherein the cavity 116N has a second width 112X (defined by the trimmed internal surfaces 112ST of the spacers 112T) that is wider than the first width 112Y. Due to the wider second width of at least a portion of the gate cavity 116N shown in FIG. 2R, and due to removal of portions of the gate insulation layer 118, at least the upper portion of the lateral space 139A may be wider (at some point above the level 115 shown in FIG. 2R) than the corresponding lateral space 139 shown in FIG. 2Q. At locations below the level 115, the lateral space 139A may be the same as described above with respect to the space 139 shown in FIG. 2Q, or there may even be a relatively small opening. In some embodiments, this lateral space 139A may be about 3-5 nm in width at some point above the level 115 shown in FIG. 2R. The space 139A may have an approximately rectangular configuration (as depicted in FIG. 2R) or it may have an outwardly tapered configuration (narrower at the bottom with increasing width toward the top of the space 139A. As thus formed, the space 139A is wide enough such that a traditional material, such as a flowable oxide material, may be formed in at least a portion of the recess 139A so that the above-described recess etching process on the layers 131, 133 and 135 may be performed. Note, so as not to obscure disclosure of the present inventions, no attempt has been made to show the limited space 139A in the gate cavities 116N, 116P after these layers of material are formed in any of the drawings other than FIG. 2R. Accordingly, by performing the internal spacer trimming process described above, the size of the openings of the gate cavities 116N, 116P, especially at the upper part of the gate cavities 116N, 116P, may be effectively increased. In turn, this helps in the process of performing the above-described recess etching process and helps in attempting to form substantially void-free gate metal based gate structures of transistor devices by enabling filling of any openings in at least the gate cavity 116N of the NMOS device 104N.

Figure 2S:
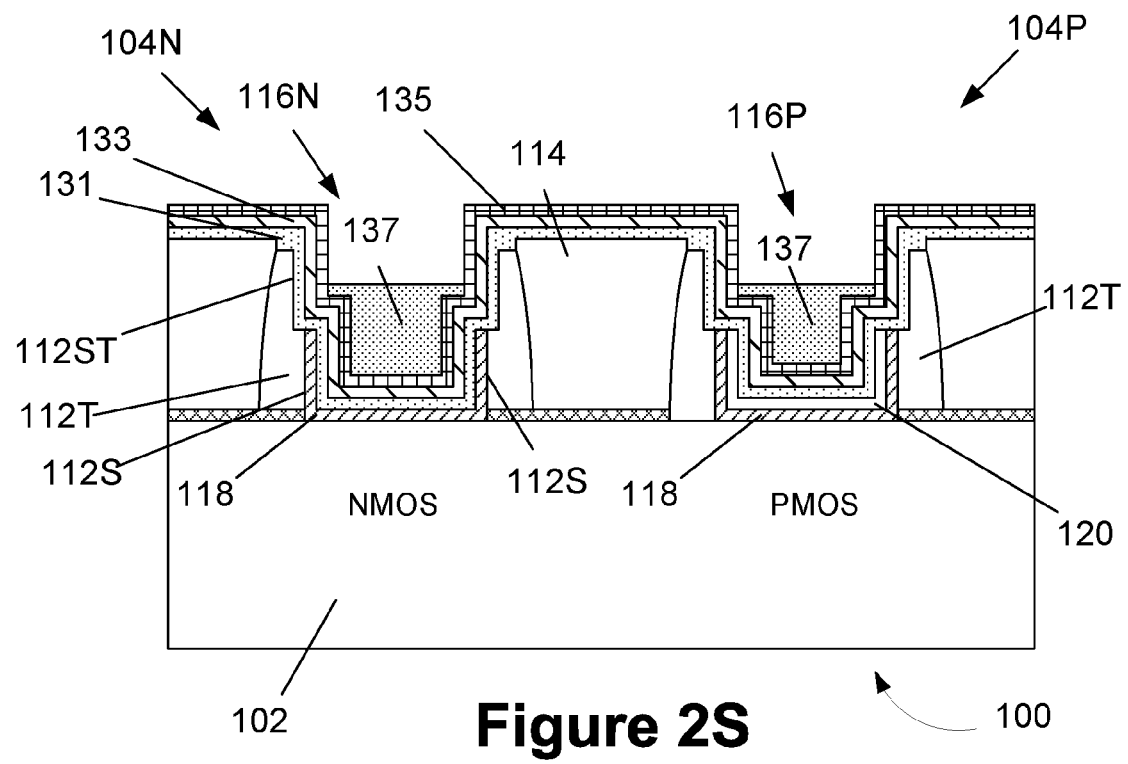

FIG. 2S depicts the product 100 after several process operations were performed. First, a third flowable material layer 137 that is made of a material that is capable of reliably filling very small width openings, such as an OPL material, was formed so as to over-fill the remaining portions of the gate cavities 116N, 116P. Thereafter, a recess etching process was performed so as to recess the third flowable material layer 137 to the desired level within the cavities 116N, 116P, the magnitude of which may vary depending upon the application. Note that, due to the widening of the openings of the gate cavities 116N, 116P, such a flowable material may still be used to reliably fill the very small spaces, e.g., within the gate cavities 116N, 116P.

Figure 2T:
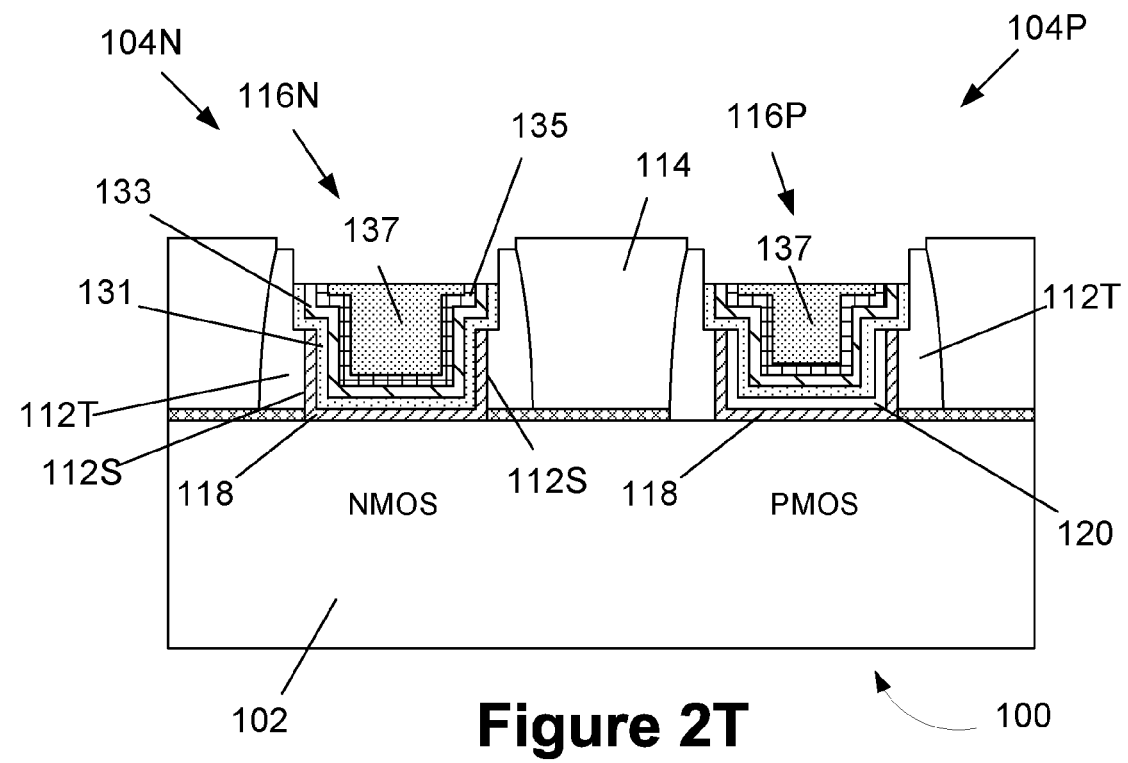

FIG. 2T depicts the product 100 after one or more dry or wet etching processes were performed to remove portions of the first N-metal layer 131, the second N-metal layer 133 and the third N-metal layer 135 positioned within the gate cavities 116N, 116P above the recessed flowable material layer 137.

Figure 2U:
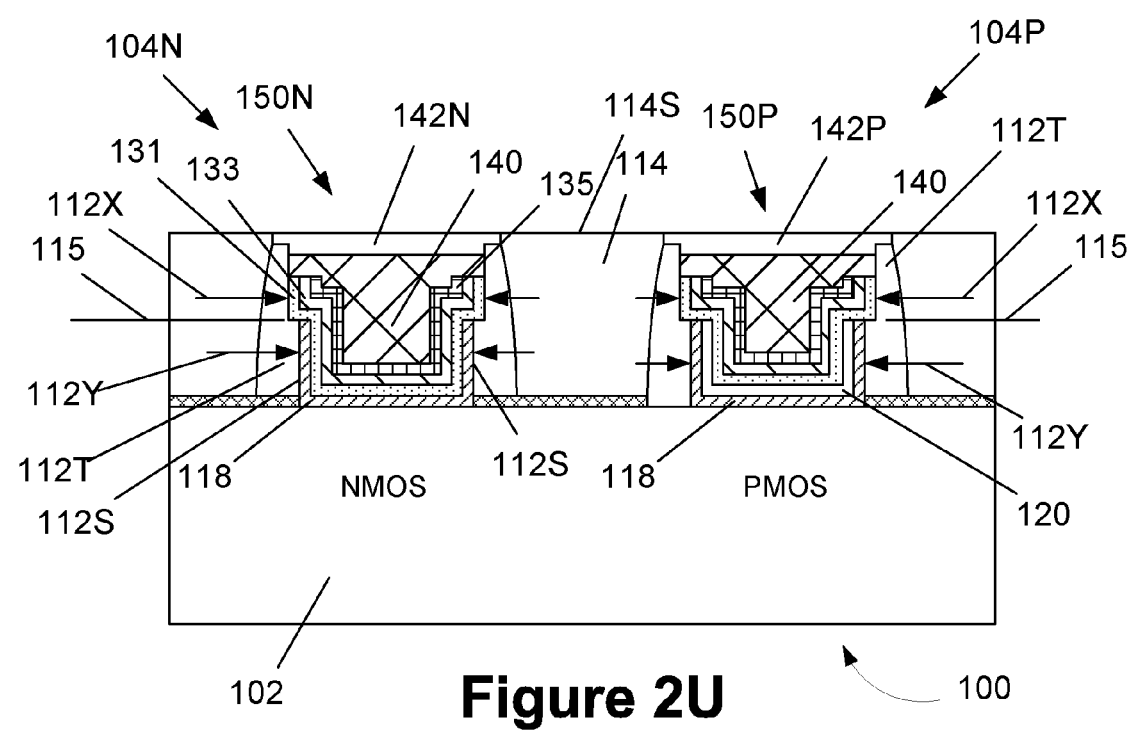

FIG. 2U depicts the product 100 after several process operations were performed. First, one or more dry or wet etching processes were performed to remove the third layer of flowable material 137 from within the gate cavities 116N, 116P. Then, a conductive material layer 140 was blanket-deposited on the product 100 so as to over-fill the gate cavities 116N, 116P. The conductive material layer 140 may be comprised of a variety of different conductive materials, e.g., a metal, a metal alloy, polysilicon, tungsten, etc., and it may be formed by performing, for example, a CVD or a PVD process. The conductive material layer 104 may be formed to any desired thickness. Next, one or more planarization processes, e.g., CMP processes, were performed to remove the portions of the conductive material layer 140 positioned above the surface 114S of the layer of insulating material 114 and outside of the gate cavities 116N, 116P. Then, a dry or wet etching process was performed to recess the conductive material layer 140 within the gate cavities 116N, 116P. In one embodiment, the recessing process may be a timed etching process and the remaining portions of the conductive material layer positioned within the gate cavities 116N, 116P may be recessed so as to have any desired thickness. Next, a gate cap layer was formed in each of the gate cavities 116N, 116P. The gate cap layers 142N, 142P may be comprised of, for example, silicon nitride, and they may be formed by blanket-depositing a layer of gate cap material (not shown) so as to over-fill the gate cavities 116N, 116P and thereafter performing one or more planarization processes, e.g., CMP processes, to remove the portions of the gate cap material layer positioned above the surface 114S of the layer of insulating material 114 and outside of the gate cavities 116N, 116P.

At the point of fabrication depicted in FIG. 2U, the final gate structures 150N, 150P have been formed for the transistors 104N, 104P, respectively. The gate cap layers 142N, 142P have also been formed to protect the gate structures 150N, 150P. By performing the internal spacer trimming process described above, the size of the gate cavities 116N, 116P provides additional room or space to form all of the various layers of material needed for the transistor devices to perform their intended functions and facilitates performing the above-described recess etching process on the metal layers 131, 133 and 135. Importantly, the methodologies disclosed herein are equally compatible with forming replacement gate structures for PMOS devices, as shown above. Thus, the methods disclosed herein have significant value as it relates to forming integrated circuit products using CMOS technology. Other benefits will be apparent to those skilled in the art after a complete reading of the present application. At the point of fabrication depicted in FIG. 2U, the integrated circuit product 100 may be completed by performing several traditional manufacturing processes, e.g., the formation of contacts to the source/drain regions of the device, the formation of various metallization layers for the product, etc.

One illustrative integrated circuit product 100 disclosed herein includes an NMOS transistor 104N that comprises a first pair of sidewall spacers 112T, that have an untrimmed internal surface 112S and a trimmed internal surface 112ST, wherein the trimmed internal surface 112ST is located vertically above the untrimmed internal surface 112S, and a gate structure 150N comprising an NMOS work function adjusting metal layer 133 positioned above a gate insulation layer 118 of the NMOS transistor 104N, wherein a first portion of the NMOS work function adjusting metal layer 133 is laterally positioned between the untrimmed internal surfaces 112S of the first pair of sidewall spacers 112T and a second portion of the NMOS work function adjusting metal layer 133 is laterally positioned between the trimmed internal surfaces 112ST of the first pair of sidewall spacers 112T. The integrated circuit product 100 also includes a PMOS transistor that comprises a second pair of sidewall spacers 112T that have a trimmed internal surface 112ST and an untrimmed internal surface 112S, wherein the trimmed internal surface 112ST is located vertically above the untrimmed internal surfaces 112S, and a gate structure 150P comprising a PMOS work function adjusting metal layer 120 positioned above a gate insulation layer 118, wherein the PMOS work function adjusting metal layer 120 is laterally positioned between the untrimmed internal surfaces 112S of the first pair of sidewall spacers 112T and does not extend into a lateral space defined by the trimmed internal surfaces 112ST of the second pair of sidewall spacers 112T. Stated another way, with reference to FIG. 2U, the PMOS work function adjusting metal layer 120 does not extend above the level 115 while the NMOS work function adjusting metal layer 133 extends below and above the level 115.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A transistor device, comprising:
  a gate structure positioned above a semiconductor substrate, said gate structure comprising:
    a gate insulation layer comprising a high-k dielectric material having a dielectric constant of approximately 10 or greater;
    a conductive gate electrode material positioned above said gate insulation layer; and
    at least one work function adjusting metal layer positioned between said gate insulation layer and said conductive gate electrode material; and
  spaced-apart sidewall spacers positioned above said substrate and adjacent sidewalls of said gate structure, an internal sidewall surface of each of said spaced-apart sidewall spacers comprising an upper sidewall surface portion and a lower sidewall surface portion positioned between said upper sidewall surface portion and a surface of said substrate, wherein a first lateral width between first upper ends of said upper sidewall surface portions is greater than a second lateral width between second upper ends of said lower sidewall surface portions, wherein said gate insulation layer covers a portion of said substrate and an entirety of said lower sidewall surface portions of said sidewall spacers but does not extend between or cover any of said upper sidewall surface portions of said sidewall spacers, and wherein said at least one work function adjusting metal layer covers an entirety of said gate insulation layer but does not extend between or cover any of said upper sidewall surface portions of said sidewall spacers.

2. The transistor device of claim 1, wherein said transistor device is an NMOS transistor device.

3. The transistor device of claim 1, wherein said transistor device is a PMOS transistor device.

4. The transistor device of claim 1, wherein said internal sidewall surfaces of said spaced-apart sidewall spacers each have a stepped cross-sectional configuration and define a first space therebetween having said first lateral width and a second space therebetween having said second lateral width.

5. The transistor device of claim 4, wherein a lower portion of said gate structure fills said second space and has said second lateral width and an upper portion of said gate structure fills said first space and has said first lateral width.

6. The transistor device of claim 1, wherein said upper sidewall surface portion of said internal sidewall surface of each of said spaced-apart sidewall spacers is an outwardly tapered surface extending substantially continuously from a first lower end proximate said second upper end of said lower sidewall surface portion to said first upper end proximate an upper surface of said gate structure.

7. The transistor device of claim 6, wherein a space defined between said lower sidewall surface portions of said spaced-apart sidewall spacers has a substantially constant width extending from second lower ends of said lower sidewall surface portions proximate said surface of said substrate to said second upper ends of said lower sidewall surface portions proximate said first lower ends of said upper sidewall surface portions.

8. The transistor device of claim 6, wherein a lower portion of said gate structure extends between said lower sidewall surface portions of said spaced-apart sidewall spacers and has said substantially constant width extending from said second lower ends of said lower sidewall surface portions proximate said surface of said substrate to said second upper ends of said lower sidewall surface portions proximate said first lower ends of said upper sidewall surface portions.

9. The transistor device of claim 6, wherein a lateral width between said outwardly tapered upper sidewall surface portions of said spaced-apart sidewall spacers increases from said second lateral width at said first lower ends of said upper sidewall surface portions proximate said second upper ends of said lower sidewall surface portions to said first lateral width at said first upper ends of said upper sidewall surface portions proximate said upper surface of said gate structure.

10. A transistor device, comprising:
a gate structure positioned above a semiconductor substrate, said gate structure comprising:
  a gate insulation layer comprising a high-k dielectric material having a dielectric constant of approximately 10 or greater;
  a conductive gate electrode material positioned above said gate insulation layer; and
  at least one work function adjusting metal layer positioned between said gate insulation layer and said conductive gate electrode material; and
spaced-apart sidewall spacers positioned above said substrate and adjacent sidewalls of said gate structure, wherein an internal sidewall surface of each of said spaced-apart sidewall spacers has a stepped cross-sectional configuration comprising an upper sidewall surface portion and a lower sidewall surface portion positioned between said upper sidewall surface portion and an upper surface of said substrate, said upper sidewall surface portions defining a first space therebetween having a substantially constant first lateral width extending from lower ends of said upper sidewall surface portions located proximate respective upper ends of said lower sidewall surface portion to upper ends of said upper sidewall surface portions located proximate an upper surface of said gate structure, and said lower sidewall surface portions defining a second space therebetween having a substantially constant second lateral width extending from lower ends of said lower sidewall surface portions located proximate said upper surface of said substrate to said upper ends of said lower sidewall surface portions located proximate said respective lower ends of said upper sidewall surface portions, wherein said first lateral width is greater than said second lateral width, wherein said gate insulation layer covers a portion of said substrate and an entirety of said lower sidewall surface portions of said sidewall spacers but does not extend between or cover any of said upper sidewall surface portions of said sidewall spacers, and wherein said at least one work function adjusting metal layer covers an entirety of said gate insulation layer but does not extend between or cover any of said upper sidewall surface portions of said sidewall spacers.

11. The transistor device of claim 10, wherein said at least one work function adjusting metal layer is a first work function adjusting metal layer, said gate structure further comprising at least a second work function adjusting metal layer positioned between said first work function adjusting metal layer and said conductive gate electrode material, wherein said at least said second work function adjusting metal layer covers an entirety of said first work function adjusting metal layer and extends between and covers at least some of said upper sidewall surface portions of said sidewall spacers.

12. An integrated circuit product, comprising:
a first transistor, comprising:
  a first gate structure comprising a first work function adjusting metal layer positioned above a first gate insulation layer; and
  a first pair of sidewall spacers positioned adjacent opposite sidewalls of said first gate structure, each of said first pair of sidewall spacers having internal sidewall surfaces comprising a first untrimmed lower surface portion and a first trimmed upper surface portion located above said first untrimmed lower surface portion, wherein a lateral width between upper ends of said first trimmed upper surface portions is greater than a lateral width between upper ends of said first untrimmed lower surface portions, wherein said first gate insulation layer covers an entirety of said first untrimmed lower surface portions of said first pair of sidewall spacers but does not extend between or cover any of said first trimmed upper surface portions of said first pair of sidewall spacers; and
a second transistor, comprising:
  a second gate structure comprising a second work function adjusting metal layer positioned above a second gate insulation layer; and
  a second pair of sidewall spacers positioned adjacent opposite sidewalls of said second gate structure, each of said second pair of sidewall spacers having internal sidewall surfaces comprising a second untrimmed lower surface portion and a second trimmed upper surface portion located above said second untrimmed lower surface portion, wherein a lateral width between upper ends of said second trimmed upper surface portions is greater than a lateral width between upper ends of said second untrimmed lower surface portions, wherein said second gate insulation layer covers an entirety of said second untrimmed lower surface portions of said second pair of sidewall spacers but does not extend between or cover any of said second trimmed upper surface portions of said second pair of sidewall spacers, and wherein said second work function adjusting metal layer covers an entirety of said second gate insulation layer but does not extend between or cover any of said second trimmed upper surface portions of said second pair of sidewall spacers.

13. The integrated circuit product of claim 12, wherein said first transistor is an NMOS transistor, said first work function adjusting metal layer is an NMOS work function adjusting metal layer, said second transistor is a PMOS transistor, and said second work function adjusting metal layer is a PMOS work function adjusting metal layer, wherein a first portion of said NMOS work function adjusting metal layer is laterally positioned between said first untrimmed lower surface portions of said first pair of sidewall spacers and a second portion of said NMOS work function adjusting metal layer is laterally positioned between said first trimmed upper surface portions of said first pair of sidewall spacers, and wherein said PMOS work function adjusting metal layer is laterally positioned between said second untrimmed lower surface portions of said second pair of sidewall spacers.

14. The integrated circuit product of claim 13, wherein an entirety of said PMOS work function adjusting metal layer is laterally positioned between said second untrimmed lower surface portions of said second pair of sidewall spacers and does not extend between said second trimmed upper surface portions of said second pair of sidewall spacers.

15. The integrated circuit product of claim 13, wherein said gate structure of said PMOS transistor further comprises a second NMOS work function adjusting metal layer positioned above said PMOS work function adjusting metal layer, a first portion of said second NMOS work function adjusting metal layer being laterally positioned between said second untrimmed lower surface portions of said second pair of sidewall spacers and a second portion of said second NMOS work function adjusting metal layer being laterally positioned between said second trimmed upper surface portions of said second pair of sidewall spacers.

16. The integrated circuit product of claim 12, wherein said internal sidewall surfaces of said respective first and second pairs of sidewall spacers each define a stepped configuration when viewed in cross-section.

17. The integrated circuit product of claim 12, wherein said first and second trimmed upper surface portions of said respective first and second pairs of sidewall spacers each define a tapered configuration when viewed in cross-section.

* * * * *